United States Patent [19]

Bohan, Jr.

[11] Patent Number: 4,845,435
[45] Date of Patent: Jul. 4, 1989

[54] SENSOR FAULT DETECTOR

[75] Inventor: John E. Bohan, Jr., Minneapolis, Minn.

[73] Assignee: Honeywell Inc., Minneapolis, Minn.

[21] Appl. No.: 145,951

[22] Filed: Jan. 20, 1988

[51] Int. Cl.⁴ .................. G01R 31/02; G08B 21/00
[52] U.S. Cl. .................................. 324/537; 340/635
[58] Field of Search .............. 324/73 R, 133, 102, 324/537; 340/660, 661, 662, 663, 664, 635

[56] References Cited

U.S. PATENT DOCUMENTS

| | | | |
|---|---|---|---|
| 3,746,981 | 7/1973 | Stone | 324/133 |
| 3,829,849 | 8/1974 | Stauffer | 340/635 |
| 3,863,034 | 1/1975 | Morrison | 340/635 |
| 4,590,533 | 5/1986 | Murata | 340/662 |

Primary Examiner—Ernest F. Karlsen
Attorney, Agent, or Firm—Mitchell J. Halista; Albin Medved

[57] ABSTRACT

A sensor fault detector for detecting a missing or shorted environment condition sensor of a plurality of sensors includes a sensor circuit for supplying a concurrent output signal from each sensor, a reference voltage circuit for supplying a predetermined reference voltage, a plurality of comparators, each of the comparators concurrently comparing a repective one of the output signals with the reference signal to produce a corresponding comparator output signal representative of a predetermined relationship between the compared signals assure the presence of properly working and connected sensors and a monitoring circuit responsive to the concurrent effect of output signals from all of the comparators to produce a control signal representative of a concurrent properly working and connected state of all of the sensors.

7 Claims, 1 Drawing Sheet

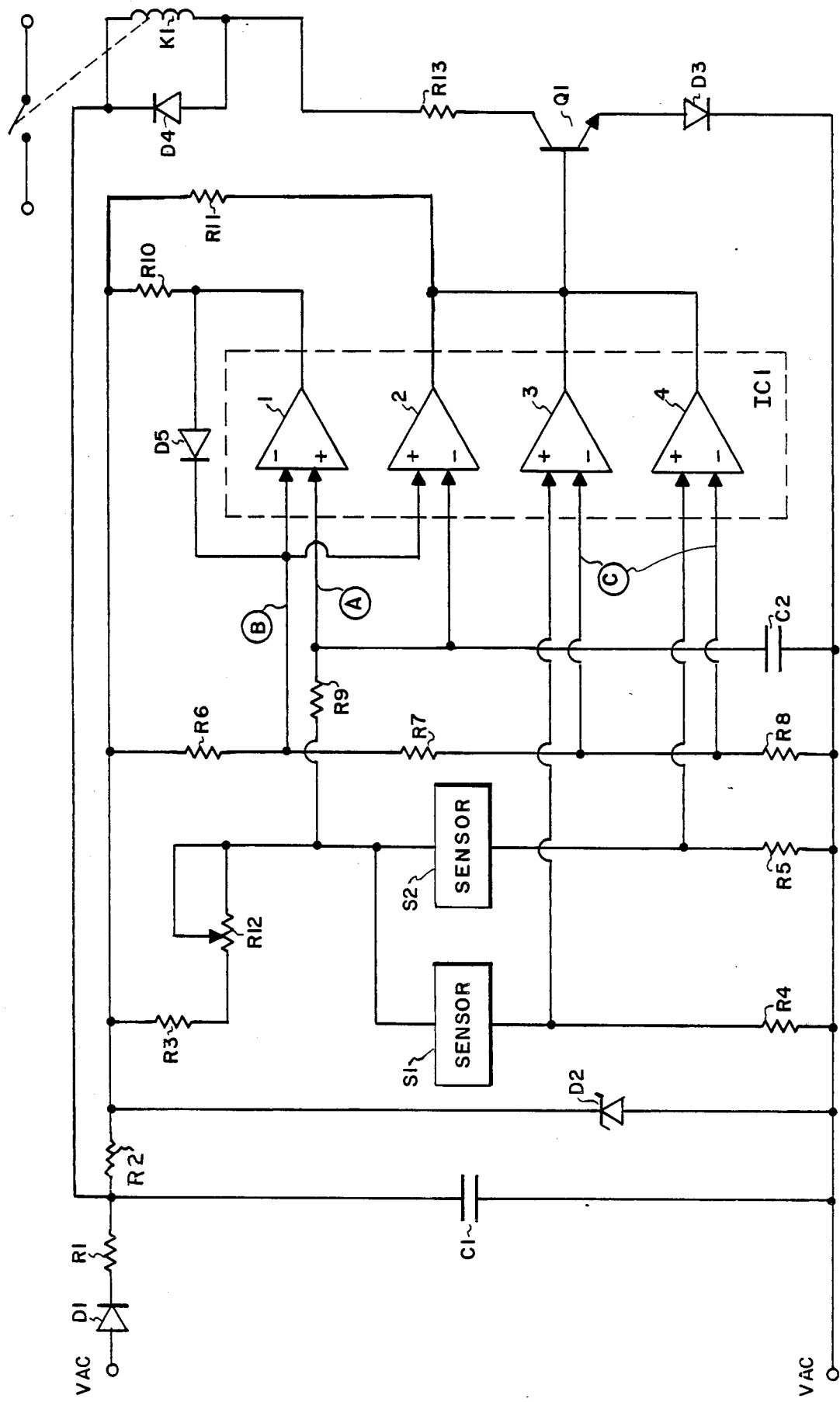

SENSOR FAULT DETECTOR

BACKGROUND OF THE INVENTION

1. Field of the Invention

The present invention relates to fault detecting apparatus. More specifically, the present invention is directed to a fault detecting apparatus for detecting the presence and operation of each of a plurality of environment condition sensors.

SUMMARY OF THE INVENTION

An object of the present invention in to provide an improved fault detecting apparatus for detecting the presence of and operation of each of a plurality of environment condition sensors.

In accomplishing this and other objects, there has been provided, in accordance with the present invention, a sensor fault detecting apparatus for detecting the presence and operation of a plurality of sensors including a sensor circuit arranged to produce a sensor output signal from each of the plurality of sensors, a reference signal circuit for providing a predetermined reference signal, a plurality of comparators with each comparator being arranged to compare a sensor output signal from a respective one of the sensors with the reference signal to produce a comparator output signal representative of a predetermined relationship between the compared signals and a monitoring circuit arranged to concurrently detect the output signals from all of the comparators to produce a control signal representative of a properly working and connected state of all of the sensors.

BRIEF DESCRIPTION OF THE DRAWING

A better understanding of the present invention may be had when the following detailed description is read in connection with the accompanying drawing, in which the single FIGURE is a schematic illustration of a sensor fault detecting apparatus embodying an example of the present invention.

DESCRIPTION OF THE PREFERRED EMBODIMENT

Referring to the single figure in more detail, there is shown a sensor fault detecting apparatus embodying an example of the present invention and arranged to receive operating power from a source of alternating current voltage (VAC) of a suitable voltage, e.g., 24 V, which is half-wave rectified by an input diode D1 and applied through a current limiting resistor R1 to a filter capacitor C1. The capacitor C1 is connected in parallel across the power input terminals VAC and also in parallel with a series combination of a second resistor R2 and a zener diode D2. The junction between the second resistor R2 and the zener diode R2 is used to provide a stable direct current (DC) voltage supply for a sensor circuit and a detector for a sensor fault condition at a suitable voltage, e.g., 9.1 V. A third resistor R3 and a potentiometer R12 are connected in series with a free end of the resistor R3 being connected to the aforesaid junction. A free end of the potentiometer R12 is connected to a pair of parallel paths including a first parallel path having a series connection of a first sensor S1 and a fourth resistor R4 and a second parallel path having a series connection of a second sensor S2 and a fifth resistor R5. The sensors S1,S2 may be environment condition sensors, e.g., temperature sensors arranged to sense water temperature in a water heating apparatus, i.e., a so-called "Aquastat."

The other or free ends of the resistors R4 and R5 are connected to a common return to the voltage supply VAC. A junction of the potentiometer R12 and the first and second parallel paths with the first and second sensors S1 and S2 is connected through a resistor R9 to supply a first voltage "A" to a noninverting input of a first comparator 1. A second capacitor C2 is connected between the noninverting input of the first comparator 1 and the common return to the supply voltage VAC to form a filter network with the resistor R9 to protect the comparator 1, which may be preferably embodied as a circuit on an integrated circuit (IC) chip, from damage by static electricity. A voltage divider network consisting of a sixth resistor R6, a seventh resistor R7 and an eighth resistor R8 connected in series between the output of the resistor R3 and the common return to the voltage supply VAC. The junction between the sixth resistor R6 and the seventh resistor R7 is connected to the inverting input of the first comparator 1 and to the noninverting input of the second comparator 2 to supply a stable predetermined second voltage "B" thereto. The output of the second comparator 2 is connected to the input of the base electrode of a first transistor Q1. The emitter electrode of the transistor Q1 is connected by a third diode D3 to the common return line to the power source VAC. The collector electrode of the transistor Q1 is connected by a collector resistor R13 to one side of a relay coil K1. The other side of the relay coil is connected to the VAC supply line through the current limiting resistor R1. A fourth diode D4 is shunted across the coil K1 to bypass voltage transients around the coil K1.

The third resistor R3, the potentiometer R12 and the parallel sensors S1 and S2 in combination with their respective resistors R4 and R5 form a temperature dependent bridge network wherein a bridge output voltage is inversely proportional to the sensed environment condition, e.g., a higher temperature results in a lower output voltage. The first voltage A is applied to the opposite inputs of the comparators 1 and 2. The series resistors R6, R7 and R8 form a voltage divider which concurrently provides a second voltage "B" to the comparators 1 and 2. As long as voltage "A" is greater than voltage "B", the output of the second comparator 2 is "high", and the output of the first comparator 1 is "low". The output of comparator 2 is used under normal conditions to determine whether the transistor Q1 will be turned "on" to energize the relay coil K1. Under the abnormal condition of a shorted sensor, the voltage "A" will be at a level less than voltage "B". As a result, the output of comparator 2 will be low to turn Q1 off to insure that the relay K1 is deenergized under a shorted sensor condition. Thus, the circuit functions to provide a temperature control which is dependent on the output from the voltage divider network containing the sensors S1 and S2. The resistor R3 can be changed to change the maximum control setpoint of the system.

The system also provides differential control wherein once the voltage "A" drops below the voltage "B", the output of the first comparator 1 will go "high" and slightly increase the voltage "B" via a tenth resistor R10 and a feedback diode D5 connected to the output of the first comparator 1. In this respect, it should be noted that the outputs of the comparators are integrated circuits which do not provide an output voltage and are either an open or closed circuit in the manner of a switch circuit. In the differential control operation the temperature of the parallel sensors S1 and S2 must go down sufficiently to cause the voltage "A" to increase above voltage B to again enable the load relay K1 to be energized. The resistor R10 may be changed to change the differential control to a desired level.

A third and a fourth comparator 3,4 are used to detect missing and malfunctioning, i.e., open, out of tolerance, etc., sensors. The voltage divider, made up of resistors R6, R7 and R8, provides a stable reference voltage "C" to the inverting inputs of the comparators 3,4. Concurrently, the outputs of each of the sensors S1,S2 are developed across the respective resistors R4,R5 and are applied to the non-inverting inputs of the comparators 3,4 be compared with the voltage "C" from the voltage divider. To enable the transistor Q1 to energize the relay coil K1 the outputs of both comparators 3,4 must be "high". This will be the case as long as sensor S1 and sensor S2 are in place and operating to develop voltages across resistors R4 and R5, respectively, that exceed the voltage "C". If one of the sensors S1,S2 is missing, the voltage balance will no longer be present and the relay coil K1 will be deenergized.

In the foregoing, the resistor R11 provides a voltage drop which serves as a base drive signal for the base electrode of the transistor Q1 if the outputs of comparators 2,3 and 4 are "high". The third diode D3 is used to prevent the transistor Q1 from turning "on" due to an imperfect shunting of current by the integrated circuit outputs of the comparators 2,3,4 through the resistor R11 to ground. The resistor R13 prevents an excessive temperature rise of the relay coil. The relative resistance of the resistors R4 and R5 can be changed to change the effect of the sensors S1 and S2, e.g., increasing resistor R4 would produce a dominant effect by sensor S2 and vice versa.

The following is a detailed list of the separate components used in a preferred construction of the illustrated example of the present invention as shown in the single FIGURE drawing:

K1: 24 volt
R1,R9: 47 ohms
R2: 2K
R3: 665
R4, R5, R13: 100 ohms
R6, R7, R11: 10K
R8: 21.5 ohms
R10: 27.4K
R12: 1.6K
C1: 330 uf
C2: 0.1 uf
D1: 1N4004
D2: 9.1V zener
D3, D4, D5: 1N4148
Comp.A,B,C,D: LM1901 (Motorola).

Accordingly, it may be seen that there has been provided, in accordance with the present invention, an improved plural sensor fault detector.

The embodiments of the present invention in which an exclusive property or privilege is claimed are defined as follows:

1. A sensor fault detector comprising
a plurality of sensors,
a sensor circuit means for supplying a concurrent separate output signal from each sensor,
a reference signal circuit means for supplying a predetermined fixed reference signal and including a source of a stable DC voltage and a voltage divider connected across said source of a stable DC voltage to provide the reference signal,
a plurality of comparator means, each of said comparator means concurrently comparing a respective one of the output signals with the reference signal to produce a comparator output signal representative of a predetermined relationship between the compared signals, said comparator means including a signal comparator having an inverting input connected to said reference signal circuit means to receive said reference signal and a non-inventing input connected to receive a respective one of said sensor output signals from said sensor circuit means and
monitoring circuit means responsive to the concurrent effect of the comparator output signal from said plurality of comparator means to produce a control signal representative of a properly working state of all of said sensors, said monitoring circuit means including a transistor having a base electrode connected to the outputs of said comparators and a resistor connected from said base electrode to one side of said source of a DC voltage.

2. A detector as set forth in claim 1 wherein said sensor circuit means includes a plurality of resistors with each resistor being connected between one end of a respective one of said sensors and one side of said DC voltage source, a resistor means connected between the other ends of all of said sensors and the other side of said DC voltage source and a plurality of output lines with each of said lines being connected between a respective one of said resistors and sensors.

3. A detector as set forth in claim 2 wherein said monitoring means includes a relay coil connected in series with a collector-emitter path of said transistor and circuit means connecting said coil and said path across said DC voltage source.

4. A sensor fault detector comprising
a plurality of sensors,
a sensor circuit means for supplying a concurrent separate output signal from each sensor,
a reference signal circuit means for supplying a predetermined fixed reference signal,
a plurality of comparator means, each of said comparator means concurrently comparing a respective one of the output signals with the reference signal to produce a comparator output signal representative of a predetermined relationship between the compared signals and
monitoring circuit means responsive to the concurrent effect of the comparator output signals from said plurality of comparator means to produce a control signal representative of a properly working state of all of said sensors and further including a second reference signal circuit means for supplying a second predetermined reference signal and a separate comparator means for comparing an energizing signal to said sensor circuit means with the second reference signal to produce an output signal from said separate comparator means representative of a predetermined relationship between the compared signals and circuit means for applying said output signal from said separate comparator means to said monitoring circuit means to produce the control signal as also being representative of an unshorted state of all of said sensors.

5. A detector as set forth in claim 4 wherein said separate comparator means includes a signal comparator having an inverting input connected to said second reference signal circuit means to receive said second reference signal and a non-inverting input connected to receive the energizing signal.

6. A detector as set forth in claim 5 wherein said second reference signal circuit includes a second voltage divider connected across said source of a DC voltage to provide the second reference signal.

7. A detector as set forth in claim 6 wherein said monitoring circuit means includes a transistor having a base electrode connected to the outputs of said comparators and a resistor connected from said base electrode to one side of said source of a DC voltage.

* * * * *